United States Patent
Dasgupta

[19]

[11] Patent Number: 6,157,259

[45] Date of Patent: Dec. 5, 2000

[54] BIASING AND SIZING OF THE MOS TRANSISTOR IN WEAK INVERSION FOR LOW VOLTAGE APPLICATIONS

[75] Inventor: Uday Dasgupta, Singapore, Singapore

[73] Assignee: Tritech Microelectronics, Ltd., Singapore, Singapore

[21] Appl. No.: 09/292,359

[22] Filed: Apr. 15, 1999

[51] Int. Cl.[7] .................................................. H03F 3/04
[52] U.S. Cl. .......................................... 330/296; 330/288
[58] Field of Search ................................... 330/257, 288, 330/261, 296, 277, 253

[56] References Cited

U.S. PATENT DOCUMENTS

| | | | |
|---|---|---|---|
| 4,525,683 | 6/1985 | Jason ............................................ | 330/28 |
| 4,555,623 | 11/1985 | Bridgewater et al. ............... | 250/214 A |
| 4,706,036 | 11/1987 | Rebeschini ............................... | 330/253 |
| 4,792,749 | 12/1988 | Kitagawa et al. ....................... | 323/314 |
| 4,910,480 | 3/1990 | Crosby ..................................... | 330/288 |
| 5,047,706 | 9/1991 | Ishibashi et al. ........................ | 323/313 |
| 5,373,253 | 12/1994 | Bailey et al. ............................ | 330/288 |

OTHER PUBLICATIONS

Vittoz et al., "CMOS Analog Integrated Circuits Based on Weak Inversion Operation", IEEE Journal of Solid–State Circuits, vol. SC–12, No. 3, Jun. 1977.

Grotjohn et al., "A Parametric Short–Channel MOS Transistor Model for Subthreshold and Strong Inversion Current", IEEE Journal of Solid–State Circuits, vol. SC–19, No. 1, Feb. 1984.

*Primary Examiner*—Robert Pascal
*Assistant Examiner*—Henry Choe
*Attorney, Agent, or Firm*—George O. Saile; Stephen B. Ackerman

[57] ABSTRACT

Methods and circuits are disclosed for low voltage (1.5 Volt and below) CMOS circuits, offering good transconductance and current driving capabilities. These goals are achieved by biasing CMOS transistors in the weak inversion region, by utilizing multiple unit-sized transistors with a fixed gate width to gate length ratio, and by maintaining a uniform threshold voltage of each unit-sized transistor. The required transistor size is obtained by parallel connection of several unit-sized transistors, such that 'n' unit sized transistors carry the required current of 'n' units. The methods and circuits disclosed eliminate deviation of the output current of current mirrors caused by threshold voltage mismatch. Disclosed are a current mirror and two typical amplifiers as examples of weak inversion design.

29 Claims, 5 Drawing Sheets

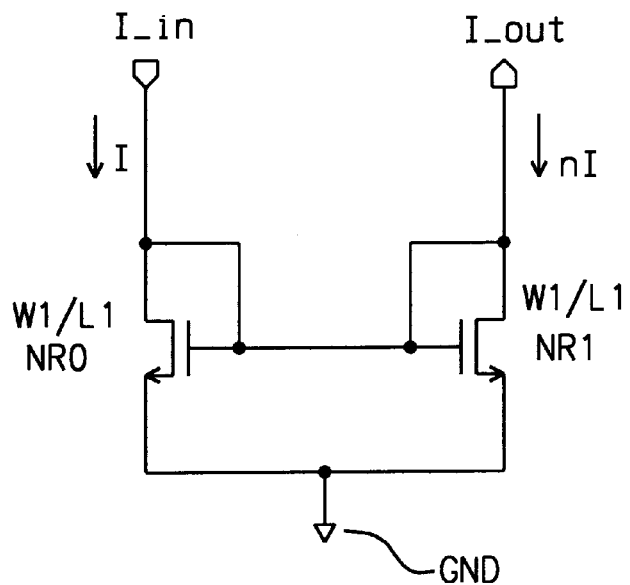
*FIG. 1a - Prior Art*
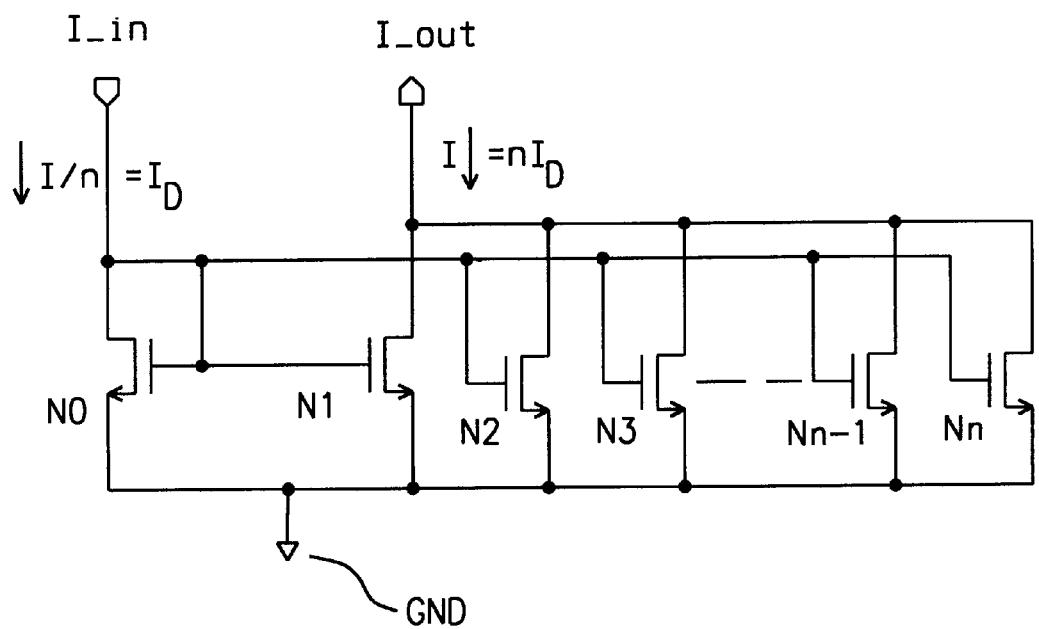
*FIG. 1b*

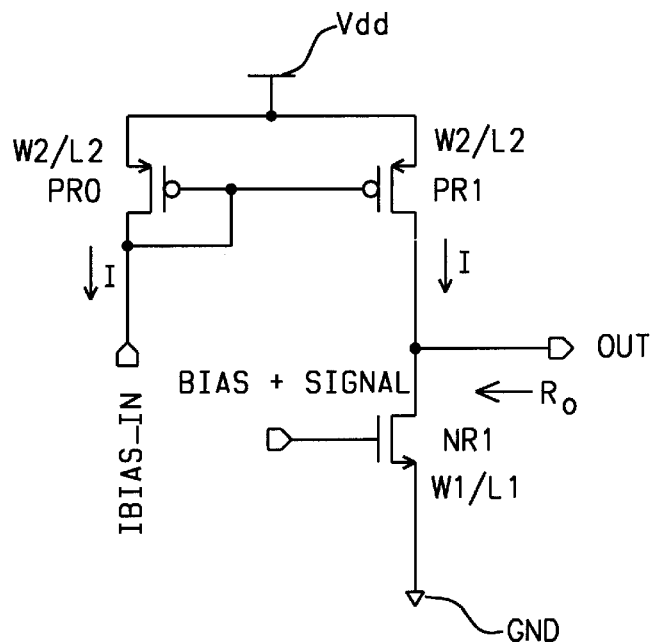
FIG. 2a – Prior Art
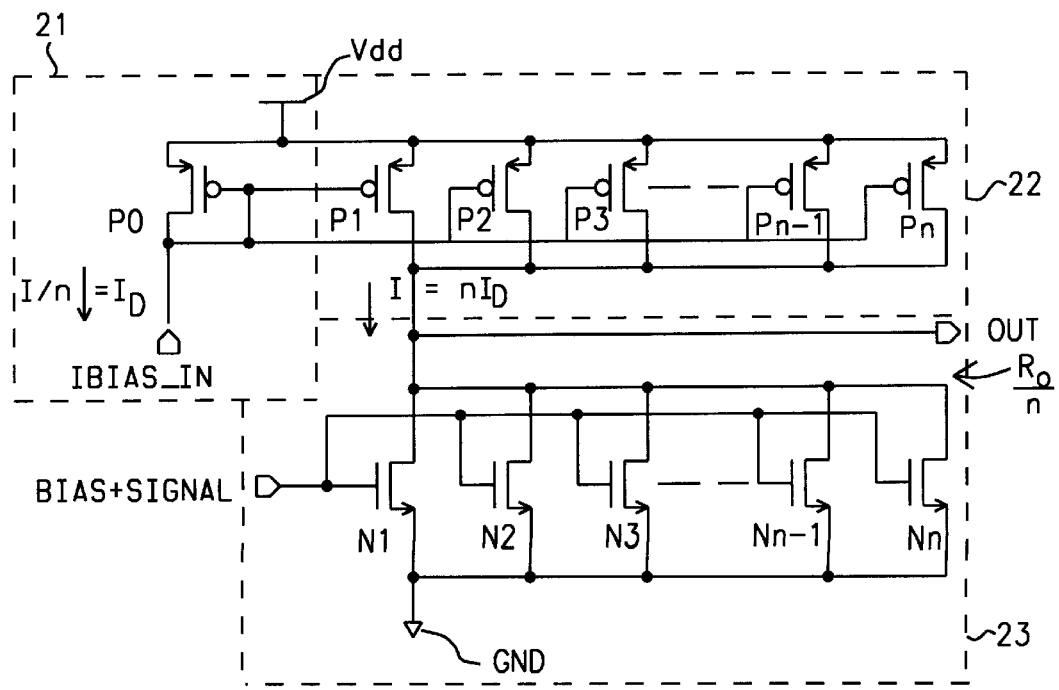
FIG. 2b

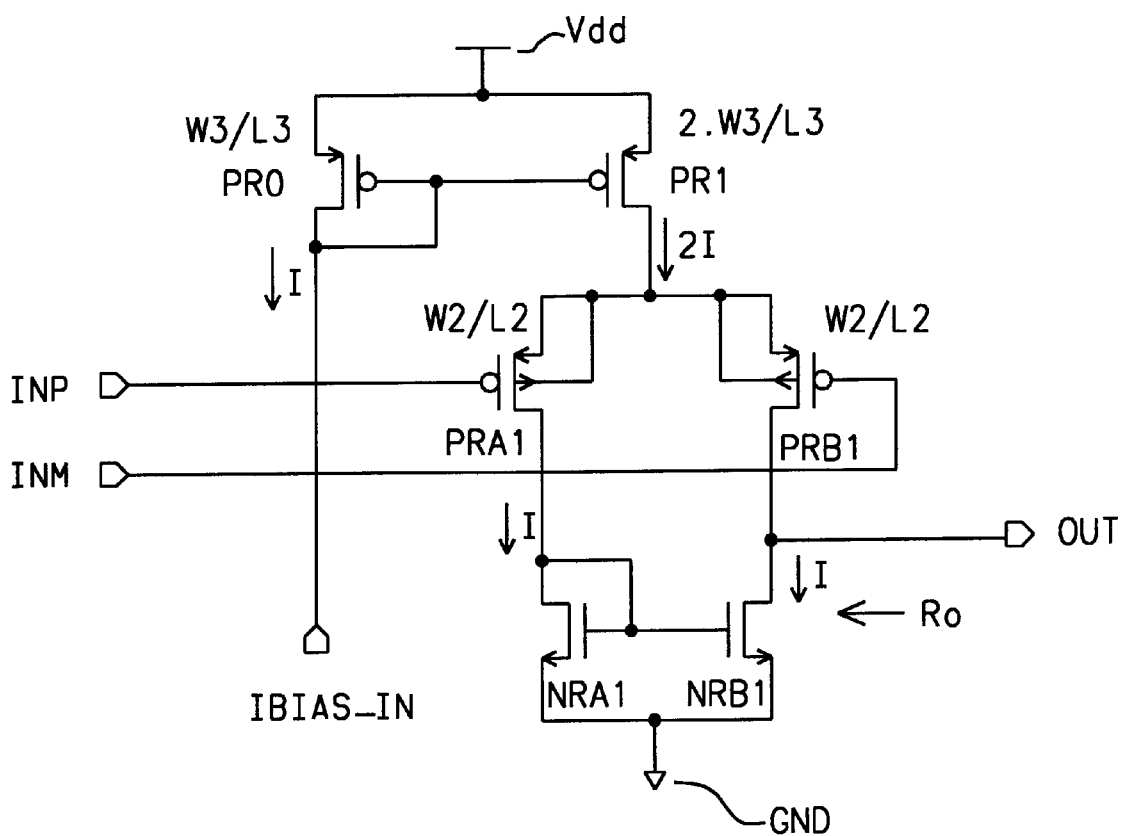
FIG. 3 - Prior Art

BIASING AND SIZING OF THE MOS TRANSISTOR IN WEAK INVERSION FOR LOW VOLTAGE APPLICATIONS

BACKGROUND OF THE INVENTION

1. Field of the Invention

The invention relates to biasing of CMOS circuits, and more particularly to avoiding problems with biasing, current mismatch, low transconductance, and sizing of circuits in the weak inversion region.

2. Description of the Related Art

It is well known that the main hurdle for low voltage (1.5V and below) circuit operation is the metal oxide semiconductor (MOS) transistor threshold voltage. Fortunately there exists a region of operation for the MOS transistor which allows low voltage operation. This is the so-called "sub-threshold" or "weak inversion" region. In this region, the transistor can be made to operate at a gate-source voltage of about 200 mV below the threshold voltage as compared to about 200 mV above it for the normal or the "strong inversion" region of operation. Also, the drain current saturation voltage in weak inversion region is also low—less than 100 mV compared to typically 200 mV for strong inversion. Therefore it is easy to see that the weak inversion region of operation provides opportunities for designing low voltage circuits.

FIG. 1a shows a conventional prior art current mirror in strong inversion with unequal sized transistors. The drain and source of an n-channel transistor NR0 are shown connected between a current supply I_IN and the gate is shown connected to the drain, creating a current source. N-channel transistor NR1 has its drain and source connected between I_OUT and ground, and its gate is connected to the gate of transistor NR0. NR1, thus acts as a current mirror, conducting a current of n times the current I flowing into transistor NR0, because NR1 has a width n times wider than transistor NR0.

FIG. 2a shows a conventional prior art common source amplifier in strong inversion. P-channel transistors PR0 and PR1 act as a current source/mirror, similar to transistors NR0 and NR1 of FIG. 1a. PR1 supplies a current I to output OUT, equal to the current flowing through PR0 to input IBIAS_IN. N-channel transistor NR1, the common source amplifier, is connected between output OUT and ground and receives at its gate a bias voltage and signal input BIAS+SIGNAL which is to be amplified. $R_o$ is the resistance seen at the output. The voltage gain is given by:

$$A_v = \frac{V_{out}}{V_{signal}} = g_{m1} \cdot R_o$$

where $g_{m1}$=transconductance of NR1

$R_o$ output resistance of PR1 and NR1 in parallel.

FIG. 3 shows a prior art differential input amplifier in strong inversion. The current mirror is identical to the one of FIG. 2a, except that PR1, the current mirror, has twice the width of PR0 to deliver twice the current (2I) of PR0. The differential amplifier consists of differential inputs INP and INM which each feed the p-channel transistor gate of a first and second CMOS circuit comprised of PRA1/NRA1 and PRB1/NRB1, respectively. NRA1 is a current source for current mirror NRB1. Each string PRA1/NRA1 and PRB1/NRB1 conduct current I. The output OUT has an output resistance of $R_o$. The voltage gain is given by:

$$A_v = \frac{V_{out}}{V_{inp} - V_{inm}} = g_{m1} \cdot R_o$$

where $g_{m1}$=transconductance of PRB1

$R_o$=output resistance of PRB1 and NRB1 in parallel.

The problems associated with weak inversion operation are firstly, absence of a design guideline for biasing the transistor in the correct region of operation, secondly the drain current mismatch for unequal sized current mirrors and thirdly very low transconductance and current driving capabilities. All these problems are resolved in the invention maintaining requirements of low voltage operation.

There are two papers which treat the subject of weak inversion operation. The first paper is by Eric Vittoz and Jean Fellrath, titled *CMOS Analog Integrated Circuits Based on Weak Inversion Operation*, IEEE Journal of Solid-State Circuits, Vol. SC-12, NO. 3, June 1977. The second paper is by Tim Grotjohn and Bernd Hoefflinger, titled *A Parametric Short-Channel MOS Transistor Model for Subthreshold and Strong Inversion Current*, IEEE Journal of Solid-State Circuits, Vol. SC-19, NO. 1. February 1984.

The following three U.S. Patents have come to our attention which utilize circuits that use biasing in the weak inversion region. U.S. Pat. No. 5,047,706 (Ishibashi et al.) describes a constant current, constant voltage circuit in which two of the MOS devices are operated in a sub-threshold region, however, there does not appear to be any discussion of the invention's deviation in output current. U.S. Pat. No. 4,792,749 (Kitagawa et al.) describes a voltage regulator for a solar cell in which a CMOS current mirror is operated in the weak inversion region. U.S. Pat. No. 4,555,623 (Bridgewater et al.) discloses a pre-amplifier for a focal plane detector array in which the devices are operated in a weak inversion region.

It should be noted that none of the above-cited examples of the related art provide multiple unit sized CMOS transistors avoiding threshold voltage mismatch and deviation of the output current.

SUMMARY OF THE INVENTION

It is an object of the present invention to provide methods and circuits for low voltage (1.5 Volt and below) applications, offering good transconductance and current driving capabilities.

Another object of the present invention is to eliminate deviation of the output current of current mirrors caused by threshold voltage mismatch.

A further object of the present invention is to provide examples of the application of weak inversion design in the form of two typical amplifiers.

These objects have been achieved by biasing CMOS transistors in the weak inversion region, by utilizing multiple unit-sized transistors with a fixed gate width to gate length ratio, and by maintaining a uniform threshold voltage of each unit-sized transistor. The required transistor size is obtained by parallel connection of several unit-sized transistors, such that 'n' unit sized transistors carry the required current of 'n' units.

BRIEF DESCRIPTION OF THE DRAWING

FIG. 1a is a circuit diagram of a current mirror of the prior art.

FIG. 1b is a circuit diagram of a current mirror of the present invention.

FIG. 2a is a circuit diagram of a common source amplifier and current mirror of the prior art.

FIG. 2b is a circuit diagram of a common source amplifier and current mirror of the present invention.

FIG. 3 is a circuit diagram of a differential input amplifier and current mirror of the prior art.

DESCRIPTION OF THE PREFERRED EMBODIMENT

Figure 4:
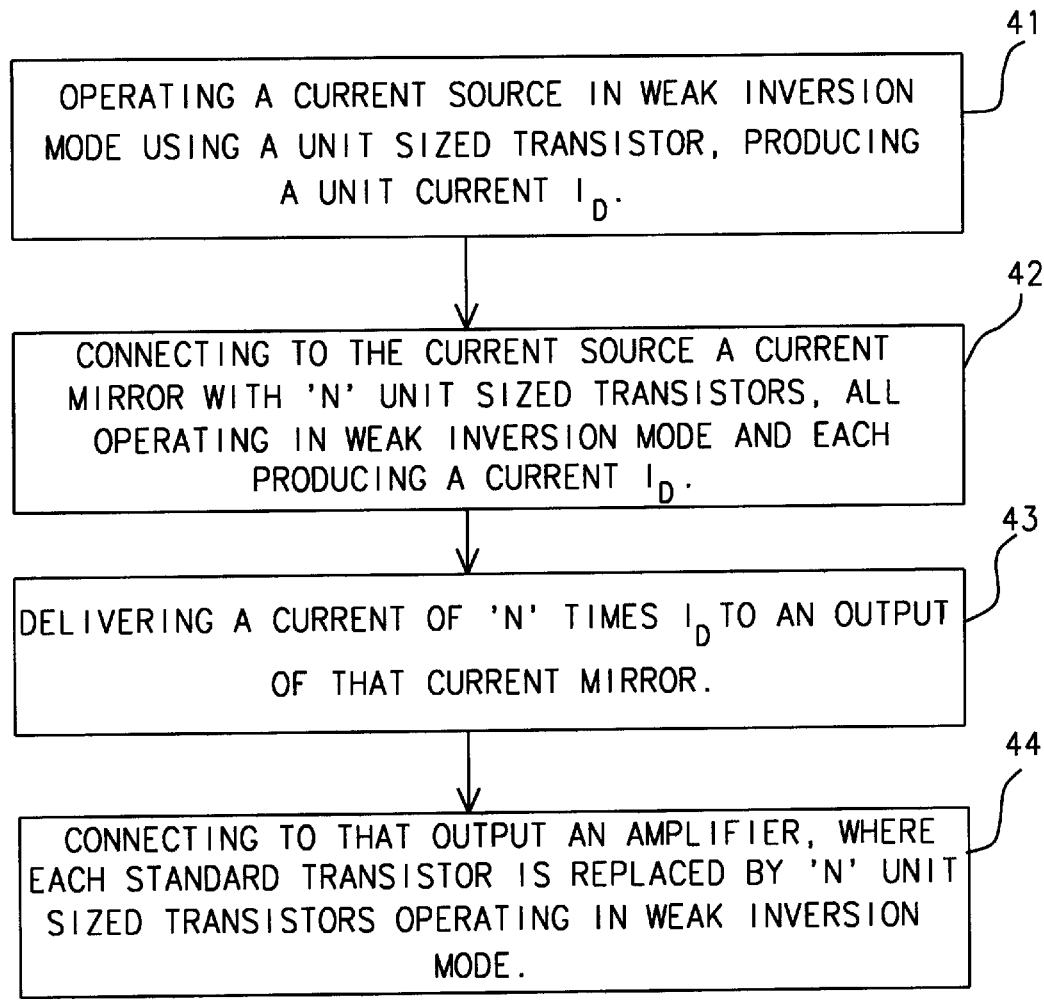
FIG. 4 is a block diagram illustrating the method of providing a differential input amplifier and current mirror of the present invention.

We will start with the current equation for weak inversion region of operation for the MOS transistor which is as follows:

$$I_D = I_T \cdot \exp[(V_{GS} - V_{T0})/\alpha \cdot V_T][1 - \exp(-V_{DS}/V_T)] \quad (1)$$

Where $$I_T = \mu \cdot C_{OX}(W/L) \cdot \alpha V_T^2 \quad (2)$$

$$C_D = \frac{\gamma}{2\sqrt{(1.5\Phi_F)}} \quad (3)$$

$$\phi_F = V_T \cdot \ln(N_A/n_i) \quad (4)$$

$$\delta = \gamma = \sqrt{(2q\epsilon_{Si}N_A)} \quad (5)$$

$$V_T = kT/q \quad (6)$$

$$\alpha = 1 + C_D/C_{OX} \quad (7)$$

$$C_{OX} = \epsilon_{ox}/t_{OX} \quad (8)$$

$I_D$=Drain current.
$V_{GS}$=Gate-source voltage.
$V_{DS}$=Drain-source voltage.
$I_T$=Corner value of current for weak to strong inversion transition.
$V_{T0}$=Threshold voltage.
$\mu$=Carrier mobility.
$C_D$=Depletion Capacitance under gate per unit area.
$C_{OX}$=Gate capacitance per unit area.
$\phi_F$=Fermi potential.
$N_A$=Substrate doping concentration.
$n_i$=Intrinsic carrier concentration of silicon.
$\gamma$=Body factor.
$\epsilon_{Si}$=Permittivity of silicon.
$\epsilon_{OX}$=Permittivity of silicon dioxide.
$t_{OX}$=Gate oxide thickness.
$V_T$=Thermal voltage.
$\alpha$=Slope factor.
k=Boltzmann's constant.
T=Temperature in deg. Kelvin.
q=Electronic charge.
W=Width of gate.
L=Length of gate.

Careful observation of (1) yields that $I_D$ must be less than $I_T$ for $V_{GS}$ to be less than $V_{T0}$ which is necessary for sub threshold or weak inversion operation. In fact, (1) is no longer valid if $I_D$ is larger than $I_T$ as the device enters strong inversion region. From (1) and (2) this restriction can be expressed as:

$$I_D < I_t \quad (1a)$$

or, $$\frac{I_D}{W/L} < \mu C_{OX} \cdot \alpha V_T^2 \quad (2a)$$

Again examining (1) we can see that $I_D$ saturates if $V_{DS}$ is greater than $3V_T$ which is about 78 mV at room temperature. For analog applications, we need to operate in this region only, therefore (1) simplifies to:

$$I_D = I_T \cdot \exp[(V_{GS} - V_{T0})/\alpha \cdot V_T] \quad (9)$$

The small signal transconductance $g_m$ of the device is obtained from (9) as:

$$g_m = \delta I_D/\delta V_{GS} = I_D/\alpha \cdot V_T \quad (10)$$

Examining (10) we see that $g_m$ is independent of the aspect ratio W/L. Therefore the aspect ratio must be determined from other considerations. From (9) we have:

$$V_{GS} = V_{T0} - \alpha \cdot V_T \cdot \ln(I_T/I_D) \quad (11)$$

or $$V_{GS} = V_{T0} - \alpha \cdot V_T \cdot \ln\left[\frac{\mu C_{OX} \cdot \alpha V_T^2}{I_D/(W/L)}\right] \quad (11a)$$

The sizing of a transistor in weak inversion should be done using (11a), keeping in mind the restriction in (2a). One has to decide on a value for W/L and a value of $I_D$ to obtain a small size and an acceptable value of $V_{GS}$ for low voltage operation keeping in mind that only the ratio $I_D$:W/L is important. Henceforth we will refer to this value of W/L as the "unit size" and this value of $I_D$ as one unit current. The ratio of $I_D$:W/L found suitable is typically 20 nA, but may range from 1 nA to 300 nA for an n-channel transistor and is about three times lower for a p-channel transistor.

Typical values for several of the parameters for a 0.25 $\mu$m CMOS process are:

$\mu C_{OX} \cdot \alpha V_T^2$=300 nA for n-, and 100 nA for p-channel transistor,
$V_{TN}$=0.5V,
$V_{TP}$=0.6V,
$\alpha \cdot V_T$=33.8 mV, Applied to (11a) we get the values listed in Tables 1 and 2.

TABLE 1

| for n-channel transistor | | | |
|---|---|---|---|
| $I_D$/(W/L) | $I_D$ | W/L | $V_{GS}$ |
| 20 nA | 100 nA | 10/2 | 0.408V |
| 1 nA | 5 nA | 10/2 | 0.307V |
| 300 nA | 1.5 $\mu$A | 10/2 | 0.500V |

TABLE 2

| for p-channel transistor | | | |
|---|---|---|---|
| $I_D/(W/L)$ | $I_D$ | W/L | $V_{GS}$ |
| 6.67 nA | 100 nA | 30/2 | 0.508V |
| 0.33 nA | 5 nA | 30/2 | 0.407V |
| 100 nA | 1.5 μA | 30/2 | 0.600V |

The choice of $V_{GS}$ depends on the minimum power supply of operation. The minimum power supply is equal to:

$$V_{GSN} V_{GSP} + 2V_{Dsat},$$

where $2V_{Dsat} = 100$ mV

For 1 Volt operation, $V_{GSN}=0.4$V and $V_{GSP}=0.5$V will be good values; the corresponding $I_D$ and W/L values are given in the Tables above.

All unit-sized transistors are assumed to be identical in all respects—this can be ensured to a large extent by careful layout considerations. In the following discussions we will see that any other size will be obtained by parallel connection of several unit-sized transistors. Thus a composite transistor which carries a current of say 'n' units of current must have 'n' unit transistors such that each unit transistor carries one unit current. A unit size of a PMOS will be three times that of an NMOS since mobility of the former is one third of that of the latter. This also follows from (11a).

FIG. 1a shows a current mirror in the strong inversion with unequal sized transistors. Using (11) and (9) one can show that the current mirror should work similarly in the weak inversion. However it is observed that the latter exhibits a lot of deviation for the output current from the theoretically predicted value. This is due to the difference in threshold voltages as a result of size difference of the transistors. The $V_{GS}$-$I_D$ relationship obeys the square law in strong inversion but is exponential in weak inversion. Therefore the effect of threshold voltage mismatch is more prominent in weak inversion.

This problem can be solved using one unit-sized transistor for the smaller transistor and several unit-sized transistors in parallel for the bigger transistor of the mirror. The solution is shown in FIG. 1b. Each unit-sized transistor carries one unit current.

From (2) we can see that the value of $I_T$ for the unit transistor is quite small because $V_T$ is a small quantity. This results in poor $g_m$ and current driving capabilities in weak inversion as can be seen from (10). These difficulties can be overcome using parallel connected unit-sized transistors carrying one unit current, each, to replace those transistors that must have large $g_m$ or must be biased at high currents for large driving capability. The advantage of this arrangement is that while the composite transistor operates at a high current, each individual unit-sized transistor still operates in the weak inversion carrying one unit current. Therefore the composite transistor still exhibits the same low voltage characteristic (in terms of $V_{GS}$ and minimum $V_{DS}$ for current saturation). The $g_m$ of the composite transistor is the sum of those of the individual unit-sized transistors, therefore, good values of $g_m$s can be obtained. This happens because the drain currents of the unit transistor add up to constitute the total current while all of them have the same gate voltage.

With the description above it may seem that the chip area required to achieve $g_m$s of the same order as in strong inversion will be enormous as the ratio of the current level in strong inversion and the unit current in weak inversion is very large. However, in fact, the situation is not so alarming. The analysis below proves the argument.

In strong inversion transconductance $g_{ms}$ at drain current $I_{DS}$ is given by:

$$g_{ms} = \sqrt{2\mu C_{OX}\left(\frac{W}{L}\right) \cdot I_{DS}} \quad (12)$$

The same in weak inversion is given by (10) assuming $I_D$ is one unit current. Now, let us say N unit-sized devices need to be connected in parallel to achieve the same amount of transconductance as in strong inversion, then using (12) and (10) we have:

$$\frac{N \cdot I_D}{\alpha V_T} = \sqrt{2\mu C_{OX}\left(\frac{W}{L}\right) \cdot I_{DS}}$$

From the above equation and (2) we can show that:

$$N = \frac{\sqrt{2\alpha \cdot I_T \cdot I_{DS}}}{I_D} \quad (13)$$

Also, from (13) we have:

$$\frac{N \cdot I_D}{I_{DS}} = \sqrt{\frac{2\alpha I_T}{I_{DS}}} \quad (13a)$$

Now α is close to unity as $C_D$ is much smaller than $C_{OX}$ as can be seen from (7). Also, $I_T$ is usually one or two orders of magnitude smaller than $I_{DS}$. Therefore, from (13) we can see that:

$$N \ll I_{DS/ID} \quad (14)$$

and from (13a):

$$\frac{N \cdot I_D}{I_{DS}} \ll 1 \quad (14a)$$

Interpreting (14) and (14a) we can see that neither the area nor the power consumption required to achieve the same transconductance as in strong inversion, by connecting multiple transistors in weak inversion, is as high as we would expect.

Figure 6:
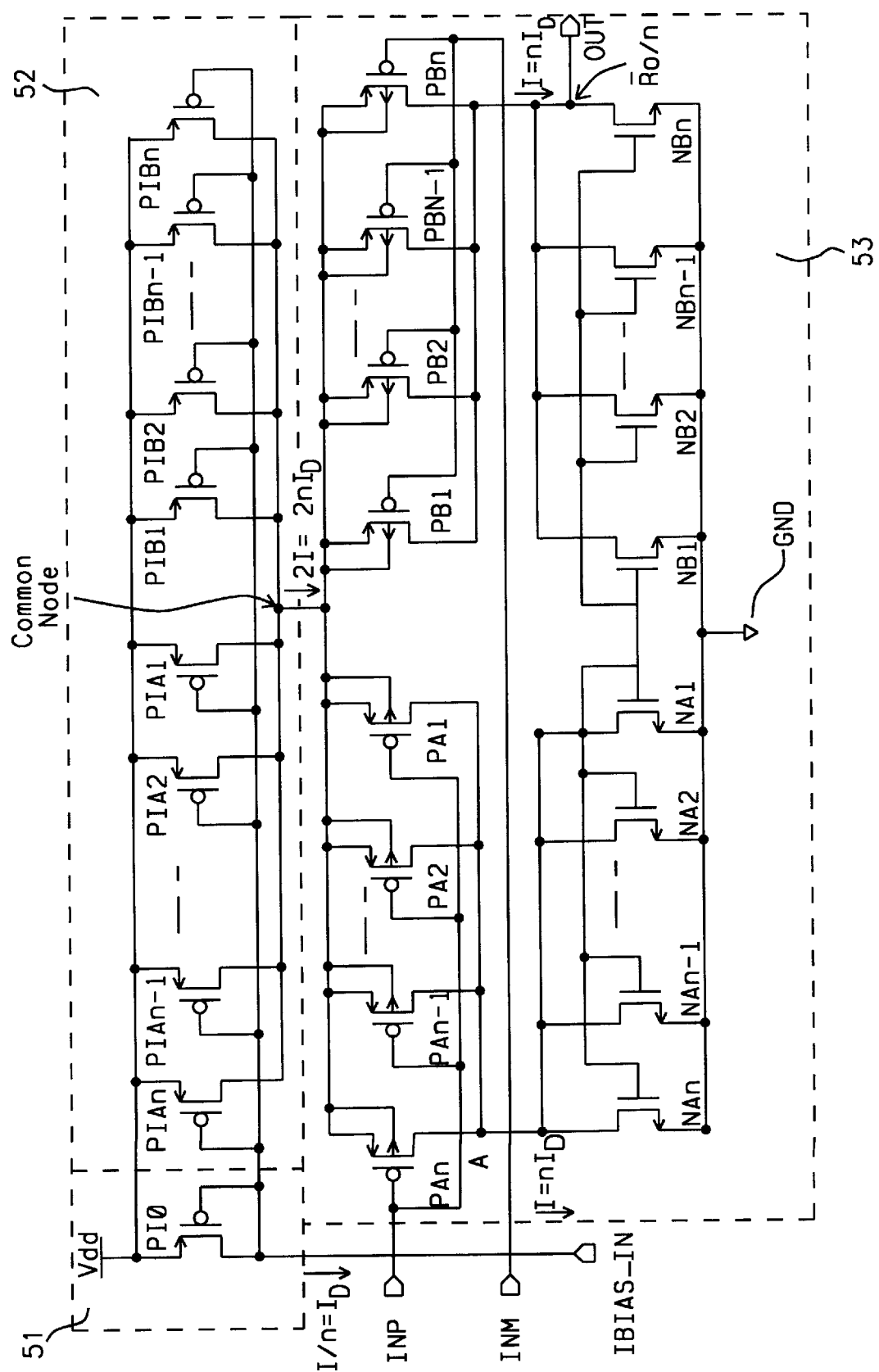
FIG. 6 is a detailed circuit diagram of a differential input amplifier and current mirror of the present invention.

Some examples of the application of this idea are shown in FIG. 2b and FIG. 6. It is worthwhile mentioning here that the above technique may be also be applied to portions of the entire circuit, different portions of the circuit having different unit sizes and unit currents to optimize area. But the basic sizing and biasing procedure remains the same as described.

Referring now to FIG. 1b, we begin a description of the method and circuit of a current mirror of a preferred embodiment the present invention. FIG. 1b shows a current mirror utilizing W/L unit-sized n-channel transistors. This circuit can be converted to a p-channel current mirror by "mirroring" it along the reference potential (or ground rail), by replacing the n-channel transistors with p-channel transistors, and by connecting the source of the p-channel transistors to a voltage potential (typically $V_{dd}$). Please compare FIG. 1a and FIG. 2a for this "mirroring". We will use the term 'CMOS transistor' to refer to either circuit.

The method of providing a current mirror operating in the weak inversion region, comprises the steps of:

providing a first CMOS transistor NO with a source-drain path and a gate and connecting it between a first terminal of a current supply (I_IN) and a second terminal of that current supply, thereby creating a current source;

providing 'n' second CMOS transistors (ranging from N1 to Nn) having the same gate size as the first CMOS transistor N0;

connecting the gate and the source of each of these 'n' second CMOS transistors to the gate and the source of the first CMOS transistor, respectively;

connecting the drains of these 'n' second CMOS transistors together creates a current mirror;

biasing the first CMOS transistor to operate in the weak inversion region by selecting a unit drain current $I_D$ for the first CMOS transistor below the strong-to-weak inversion point of a CMOS transistor.

Each of these 'n' second CMOS transistors is operating in the weak inversion region of a CMOS transistor because gate to source voltage and gate current are identical to those of the first CMOS transistor. The drain currents of the 'n' second CMOS transistors add up to provide a total current equal to 'n' times the drain current of each of the 'n' CMOS transistors. The first and the 'n' second CMOS transistors of the current mirror circuit have a gate width of W and a gate length of L, the ratio of W to L is called 'unit size'. It is, of course, understood that the 'unit size' of a p-channel transistor is one third of that of an n-channel transistor. The total transconductance $g_m$ of all the 'n' second CMOS transistors is the sum of the individual transconductance of each of the unit sized 'n' second CMOS transistors. The ratio of unit drain current ID to unit size—$I_D$:(W/L)—is typically 20 nA, but ranges from 1 nA to 300 nA for an n-channel transistor. Analogous, the ratio of unit drain current $I_D$ to the unit size for a p-channel transistor is typically 20/3 or about 7 nA, but ranges from ⅓ nA to 100 nA. The first CMOS transistor and the 'n' second CMOS transistors operate with a drain-to-source voltage ranging from $V_{DD}$ to less than 100 mV.

Referring now to FIG. 2b, we describe next the method and circuit of a common source amplifier of the preferred embodiment of the present invention. The circuit of FIG. 2b is comprised of a current source 21, a current mirror 22, and an amplifier part 23. The circuit of FIG. 2b can be converted to an n-channel current mirror and a p-channel amplifier by "mirroring" the circuit along the reference potential (or ground rail), by exchanging n-channel transistors with p-channel transistors, and by connecting the drain of the n-channel transistors to a voltage potential (typically $V_{dd}$) and the drain of the p-channel transistors to a reference potential (typically ground). Please compare FIG. 1a and FIG. 2a for this "mirroring".

The method of providing a common source amplifier operating in the weak inversion region, comprises the steps of:

providing a current mirror as detailed above with reference to FIG. 1b and reference to "mirroring" and noting that the current mirror of FIG. 2b is shown implemented using p-channel transistors P0 as a current source 21 and p-channel transistors P1 to Pn as current mirror 22. The current for the drain of P0 is shown provided by input BIAS_IN. The amplifier part 23 is provided by 'n' n-channel transistors N1 to Nn, each having a source-drain path and a gate, the 'n' n-channel transistors having the same gate size as p-channel transistor P0;

connecting the gates of each of the 'n' n-channel transistors to an input node BIAS+SIGNAL which receives a bias voltage and signal input that is to be amplified;

connecting the sources of each of the 'n' n-channel transistors to a reference potential (typically ground); and connecting the drains of each of the 'n' n-channel transistors to output node OUT.

and receives at its gate a bias voltage and signal input BIAS+SIGNAL which is to be amplified.

$\overline{R}_o$ is the resistance seen at output node OUT. The voltage gain is given by:

$$A_v = V_{out}/V_{signal} = \overline{g}_{m1} \cdot \overline{R}_o$$

where $\overline{g}_{m1}$=transconductance of N1

$\overline{R}_o$=output resistance of N1 and P1 in parallel.

All transistors of the common source amplifier are biased to operate in the weak inversion region of a CMOS transistor by selecting a unit drain current $I_D$ for the first CMOS transistor P0 below the strong-to-weak inversion point of a CMOS transistor. Drain currents of the 'n' second p-channel transistors add up to provide a total current equal to 'n' times the drain current of each of the 'n' p-channel transistors. All 'n' second p-channel and 'n' n-channel transistors are biased to have the same gate voltage. All p-channel and n-channel transistors of the common source amplifier have a gate width of W and a gate length of L, where the ratio of W to L is called 'unit size'. As already mentioned the 'unit size' of a p-channel transistor is one third of an n-channel transistor. The ratio of unit drain current $I_D$ to the unit size is typically 20 nA, but ranges from 1 nA to 300 nA for an n-channel transistor and one third for p-channel transistors. The common source amplifier provides a current amplification equal to 'n' at the output node OUT.

Referring now to FIG. 4 we describe in a block diagram a method of providing a differential input amplifier operating in the weak inversion region. In Block 41 we operate a current source in weak inversion mode using a unit sized transistor, producing a unit current $I_D$. In Block 42 a current mirror is connected to the current source of Block 41, where the current mirror has 'n' unit sized transistors, all operating in weak inversion mode as well, where each transistor is producing a current $I_D$. A current 'n' times $I_D$ is delivered in Block 43 at an output of the current mirror. In Block 44 an amplifier is connected to that output (in the presently discussed embodiment this is a differential input amplifier, however, this method is applicable to any other amplifier, as disclosed previously and shown in FIG. 2b), where each standard transistor of that amplifier is replaced by 'n' unit sized transistors operating in weak inversion mode.

In further elaboration of the method of providing a differential input amplifier we wish to point out that the number of unit transistors provided in the current mirror is '2n', because a differential input amplifier is comprised of two transistors one for each input, as can clearly be seen by reference to FIG. 3. Because each transistor requires a current 'n' times I, the current mirror needs to provide a current of '2n' times I.

Figure 5:
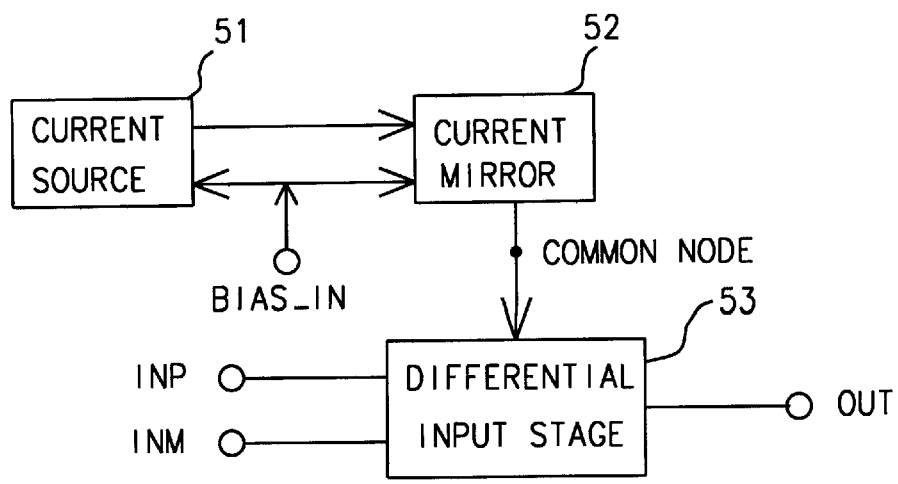
FIG. 5 is a high level circuit block diagram of a differential input amplifier and current mirror of the present invention.

Next we give an overview of the circuit of the differential input amplifier in terms of the block diagram of FIG. 5. Block 51, the current source, and Block 52 receive input BIAS_IN. Block 52 is connected through the Common Node to Block 53, the differential input stage, which receives inputs INP and INM and furnishes amplifier output OUT of the differential input amplifier.

We now offer, in FIG. 6, a detailed description of the differential input amplifier operating in the weak inversion region, where is transistor has a unit-sized ratio of W/L:

Current source 51 is a first p-channel transistor PI0 with a source-drain path and a gate, the source of the first p-channel transistor is connected to a voltage potential $V_{dd}$, the gate and drain of the first p-channel transistor are connected to a biasing signal BIAS_IN, where the first p-channel transistor provides a current source;

Current mirror 52 has a first input, a second input and a common node, the first input is connected to the gate of the first p-channel transistor, the second input is connected to the source of the first p-channel transistor, where current mirror 52 provides a source of current at the common node. The current mirror further comprises:

'2n' second p-channel transistors PIA1 to PIAn and PIB1 to PIBn, each transistor having a source-drain path and a gate, where the '2n' second p-channel transistors are all connected in parallel, gate and source of each of the '2n' second p-channel transistors connected to the first and second input of current mirror 52, respectively, and the drains of each of the '2n' second p-channel transistor connected to the common node of the current mirror;

Differential input stage 53 has plus input INP, minus input INM, a connection to the common node, and an amplifier output OUT, the differential input stage amplifies signals at INP and INM and provides an amplified signal at amplifier output OUT. The differential input stage further comprises:

a first set of 'n' p-channel transistors PA1 to PAn, each having a source-drain path and a gate, the gates of each of the first set of 'n' p-channel transistors connected to INP, the sources of each of the first set of 'n' p-channel transistors connected to the common node, and the drains of each of the first set of 'n' p-channel transistors connected to a node A;

a second set of 'n' p-channel transistors PB1 to PBn, each having a source-drain path and a gate, the gates of each of the second set of 'n' p-channel transistors connected to INM, the sources of each of the second set of 'n' p-channel transistors connected to the common node, and the drains of each of the second set of 'n' p-channel transistors connected to amplifier output OUT;

a first set of 'n' n-channel transistors NA1 to NAn, each having a source-drain path and a gate, the gates and drains of the first set of 'n' n-channel transistors connected to node A, the sources of the second set of 'n' n-channel transistors connected to a reference potential GND (typically ground); and a second set of 'n' n-channel transistors NB1 to NBn, each having a source-drain path and a gate, the gates of the second set of 'n' n-channel transistors connected node A, the sources of the second set of 'n' n-channel transistors connected to reference potential GND, and the drains of each of the second set of 'n' n-channel transistors connected to amplifier output OUT. The output OUT has an output resistance of $\overline{R}_o$. The voltage gain is given by:

$$A_v = \frac{v_{Out}}{v_{inp} - v_{inm}} = \overline{g}_{m1} \cdot \overline{R}_o$$

where $\overline{g}_{m1}$=transconductance of PB1, and $\overline{R}_o$ output resistance of PB1 and NB1 in parallel.

All p-channel and n-channel transistors of the differential input amplifier are biased to operate in the weak inversion region by selecting a unit drain current below the strong-to-weak inversion point of a CMOS transistor.

Advantages of this present invention are in summary:

circuit operation at voltages below 1.5 Volt no drain current mismatch for unequal sized current mirrors high transconductance and good current driving abilities adaptable to various circuits and portions of circuits different portions of a circuit can have different unit sizes and different unit currents to optimize silicon area reasonable power consumption and area compared to prior art circuit operated in strong inversion.

While the invention has been particularly shown and described with reference to the preferred embodiments thereof, it will be understood by those skilled in the art that various changes in form and details may be made without departing from the spirit and scope of the invention.

What is claimed is:

1. A method of providing a current mirror operating in the weak inversion region, comprising the steps of:

providing a first CMOS transistor with a source-drain path and a gate;

connecting said gate and said drain of said first CMOS transistor to a first terminal of a current supply;

connecting said source of said first CMOS transistor to a second terminal of said current supply, thereby creating a current source;

providing 'n' second CMOS transistors, each having a source-drain path and a gate, said 'n' second CMOS transistors having the same gate size as said first CMOS transistor;

connecting said gate and said source of each of said 'n' second CMOS transistors to said gate and said source of said first CMOS transistor, respectively;

connecting said drains of said 'n' second CMOS transistors together thereby creating a current mirror; and biasing said first CMOS transistor to operate in the weak inversion region by selecting a unit drain current $I_D$ for said first CMOS transistor below the strong-to-weak inversion point of a CMOS transistor.

2. The method of claim 1, wherein each of said 'n' second CMOS transistors is operating in the weak inversion region of a CMOS transistor.

3. The method of claim 1, wherein drain currents of said 'n' second CMOS transistors add up to provide a total current equal to 'n' times the drain current of each of said 'n' CMOS transistors.

4. The method of claim 1, wherein said 'n' second CMOS transistors all have the same gate voltage.

5. A current mirror circuit operating in the weak inversion region, comprising:

a first CMOS transistor with a source-drain path and a gate, said gate and said drain of said first CMOS transistor connected to a first terminal of a current supply, said source of said first CMOS transistor connected to a second terminal of said current supply, said first CMOS transistor acting as a current source conducting a unit drain current $I_D$, where said first CMOS transistor is biased to operate in the weak inversion region of a CMOS transistor by selecting said unit drain current for said first CMOS transistor below the strong-to-weak inversion point of CMOS transistors; and 'n' second CMOS transistors, each having a source-drain path and a gate, said gate and said source of each of said 'n' second CMOS transistors connected to said gate and said source of said first CMOS transistor, respectively, said drains of said 'n' second CMOS transistors connected together to provide a supply of current, and said 'n' second CMOS transistors acting as a current mirror of said current source.

6. The current mirror circuit of claim 5, wherein said first and said 'n' second CMOS transistors have a gate width of W and a gate length of L, the ratio of said W to said L called unit size.

7. The current mirror circuit of claim 6, wherein the transconductance $g_m$ of the sum of said 'n' second CMOS transistors is 'n' times the transconductance of each of said unit sized 'n' second CMOS transistors.

8. The current mirror circuit of claim 7, wherein a ratio of said drain current $I_D$ to said unit size may range from 1 nA to 300 nA for an n-channel transistor.

9. The current mirror circuit of claim 7, wherein a ratio of said drain current $I_D$ to said unit size may range from ⅓ nA to 100 nA for a p-channel transistor.

10. The current mirror circuit of claim 5, wherein said first and said 'n' second CMOS transistors operate with a drain-to-source voltage ranging from $V_{dd}$ to less than 100 mV.

11. A method of providing a common source amplifier operating in the weak inversion region, comprising the steps of:

providing a first p-channel transistor with a source-drain path, and a gate;

connecting said source of said first p-channel transistor to a voltage potential;

connecting said gate and said drain of said first p-channel transistor to a biasing circuit;

providing 'n' second p-channel transistors, each having a source-drain path, and a gate, said 'n' second p-channel transistors having the same gate size as said first p-channel transistor;

connecting said gate and said source of each of said 'n' second p-channel transistors to said gate and said source of said first p-channel transistor, respectively;

connecting said drains of said 'n' second p-channel transistors together in an output node providing a current sink;

biasing said first p-channel transistor to operate in the weak inversion region by selecting a unit drain current $I_D$ for said first p-channel transistor below the strong-to-weak inversion point of p-channel transistors;

providing 'n' n-channel transistors, each having a source-drain path and a gate, said 'n' n-channel transistors having the same gate size as said first p-channel transistor;

connecting said gates of each of said 'n' n-channel transistors to an input node;

connecting said sources of each of said 'n' n-channel transistors to a reference potential; and connecting said drains of each of said 'n' n-channel transistors to said output node.

12. The method of claim 11, wherein all of said transistors are operating in the weak inversion region of a CMOS transistor.

13. The method of claim 11, wherein drain currents of said 'n' second p-channel transistors add up to provide a total current equal to 'n' times said drain current of each of said 'n' p-channel transistors.

14. The method of claim 11, wherein said 'n' second p-channel and said 'n' n-channel transistors are all biased to have the same gate voltage.

15. A common source amplifier operating in the weak inversion region, comprising:

a first p-channel transistor with a source-drain path and a gate, said source of said first p-channel transistor connected to a voltage potential, said gate and said drain of said first p-channel transistor connected to a biasing circuit, said first p-channel transistor providing a current source conducting a unit drain current $I_D$, where said first p-channel transistor is biased to operate in the weak inversion region of a p-channel transistor by selecting said unit drain current ID for said first p-channel transistor below the strong-to-weak inversion point of a p-channel transistor;

'n' second p-channel transistors, each having a source-drain path and a gate, said gate and said source of each of said 'n' second p-channel transistors connected to said gate and said source of said first p-channel transistor, respectively, said drains of said 'n' second p-channel transistors connected together to an output node, said 'n' second p-channel transistors acting as a current mirror of said current source; and 'n' n-channel transistors, each having a source-drain path and a gate, said gate of each of said 'n' n-channel transistors connected to an input node, said sources of said 'n' n-channel transistors connected together to a reference potential, said drains of said 'n' n-channel transistors connected together to said output node, said 'n' n-channel transistors providing an amplified signal at said output node.

16. The common source amplifier of claim 15, wherein each of said 'n' second p-channel transistors is biased to operate in the weak inversion region by selecting a unit drain current for each of said 'n' second p-channel transistor below the strong-to-weak inversion point of a p-channel transistor.

17. The common source amplifier of claim 15, wherein each of said 'n' second n-channel transistors is biased to operate in the weak inversion region, when no signal is present at said input node, by selecting a unit drain current for each of said 'n' second n-channel transistor below the strong-to-weak inversion point of an n-channel transistor.

18. The common source amplifier of claim 15, wherein said first p-channel transistor has a gate width of W and a gate length of L, the ratio of said W to said L called unit size.

19. The common source amplifier of claim 18, wherein each of said 'n' second p-channel and said 'n' n-channel transistors is of same said unit size.

20. The common source amplifier of claim 19, wherein a ratio of said drain current $I_D$ to said unit size may range from 1 nA to 300 nA for an n-channel transistor.

21. The common source amplifier of claim 19, wherein a ratio of said drain current $I_D$ to said unit size may range from ⅓ nA to 100 nA for a p-channel transistor.

22. A method of providing a differential input amplifier operating in the weak inversion region, comprising the steps of:

providing a first p-channel transistor with a source-drain path and a gate;

connecting said source of said first p-channel transistor to a voltage potential;

connecting said gate and said drain of said first p-channel transistor to a biasing circuit;

biasing said first p-channel transistor to operate in the weak inversion region by selecting a drain current for said first p-channel transistor below the strong-to-weak inversion point of p-channel transistors;

providing '2n' second p-channel transistors, each having a source-drain path and a gate, where said '2n' second p-channel transistors are all connected in parallel, said '2n' second p-channel transistors having the same gate size as said first p-channel transistor;

connecting said gate and said source of each of said '2n' second p-channel transistors to said gate and said source of said first p-channel transistor, respectively;

connecting said drains of each of said '2n' second p-channel transistors together in a common node providing a current sink;

providing a first set of 'n' p-channel transistors, each having a source-drain path and a gate, said first set of 'n' p-channel transistors having the same gate size as said first p-channel transistor;

connecting said gates of each of said first set of 'n' p-channel transistors to a plus input node;

connecting said sources of each of said first set of 'n' p-channel transistors to said common node;

connecting said drains of each of said first set of 'n' p-channel transistors to a node A;

providing a second set of 'n' p-channel transistors, each having a source-drain path and a gate, said second set of 'n' p-channel transistors having the same gate size as said first p-channel transistor;

connecting said gates of each of said second set of 'n' p-channel transistors to a minus input node;

connecting said sources of each of said second set of 'n' p-channel transistors to said common node;

connecting said drains of each of said second set of 'n' p-channel transistors to an amplifier output;

providing a first set of 'n' n-channel transistors, each having a source-drain path and a gate, said first set of 'n' n-channel transistors having the same gate size as said first p-channel transistor;

connecting said gates and said drains of said first set of 'n' n-channel transistors to said node A;

connecting said sources of said second set of 'n' n-channel transistors to a reference potential;

providing a second set of 'n' n-channel transistors, each having a source-drain path and a gate, said second set of 'n' n-channel transistors having the same gate size as said first p-channel transistor;

connecting said gates of said second set of 'n' n-channel transistors to said node A;

connecting said sources of said second set of 'n' n-channel transistors to said reference potential; and connecting said drains of each of said second set of 'n' n-channel transistors to said amplifier output.

23. The method of claim 22, wherein each of said p-channel and n-channel transistors are biased to operate in the weak inversion region of a CMOS transistor.

24. The method of claim 22, wherein drain currents of said '2n' second p-channel transistors are added up to provide a total current equal to '2n' times the drain current of each of said '2n' second p-channel transistors.

25. A differential input amplifier operating in the weak inversion region, comprising:

a first p-channel transistor with a source-drain path and a gate, said source of said first p-channel transistor connected to a voltage potential, said gate and said drain of said first p-channel transistor connected to a biasing circuit, said first p-channel transistor providing a current source;

a current mirror with a first input, a second input and a common node, said first input connected to said gate of said first p-channel transistor, said second input connected to said source of said first p-channel transistor, said current mirror providing a source of current at said common node, said current mirror further comprising:

'2n' second p-channel transistors, each having a source-drain path and a gate, where said '2n' second p-channel transistors are all connected in parallel, said gate and said source of each of said '2n' second p-channel transistors connected to said first and said second input of said current mirror, respectively, and said drains of each of said '2n' second p-channel transistors connected to said common node;

a differential input stage with a plus input, a minus input, a connection to said common node, and an amplifier output, said differential input stage amplifying signals at said plus input node and said minus input node and providing an amplified signal at said amplifier output, said differential input stage further comprising:

a first set of 'n' p-channel transistors, each having a source-drain path and a gate, said gates of each of said first set of 'n' p-channel transistors connected to said plus input, said sources of each of said first set of 'n' p-channel transistors connected to said common node, and said drains of each of said first set of 'n' p-channel transistors connected to a node A;

a second set of 'n' p-channel transistors, each having a source-drain path and a gate, said gates of each of said second set of 'n' p-channel transistors connected to said minus input, said sources of each of said second set of 'n' p-channel transistors connected to said common node, and said drains of each of said second set of 'n' p-channel transistors connected to said amplifier output;

a first set of 'n' n-channel transistors, each having a source-drain path and a gate, said gates and said drains of said first set of 'n' n-channel transistors connected to said node A, said sources of said first set of 'n' n-channel transistors connected to a reference potential; and a second set of 'n' n-channel transistors, each having a source-drain path and a gate, said gates of said second set of 'n' n-channel transistors connected to said node A, said sources of said second set of 'n' n-channel transistors connected to said reference potential, and said drains of each of said second set of 'n' n-channel transistors connected to said amplifier output.

26. The differential input amplifier of claim 25, wherein said first p-channel transistor is biased to operate in the weak inversion region by selecting a unit drain current for said first p-channel transistor below the strong-to-weak inversion point of p-channel transistors.

27. The differential input amplifier of claim 25, wherein said transistors of said current mirror are biased to operate in the weak inversion region by selecting a unit drain current for said transistors of said current mirror below the strong-to-weak inversion point of p-channel transistors.

28. The differential input amplifier of claim 25, wherein said transistors of said differential input stage are biased to operate in the weak inversion region, when no signal is present at said plus and said minus input, by selecting a unit drain current for said transistors of said differential input stage below the strong-to-weak inversion point of CMOS transistors.

29. The common source amplifier of claim 25, wherein each of said p-channel transistors and said n-channel transistors is of the same unit size having a gate width to gate length ratio W/L.

* * * * *